United States Patent
Wang et al.

(10) Patent No.: US 12,306,495 B2
(45) Date of Patent: May 20, 2025

(54) SUBSTRATE, BACKLIGHT MODULE AND DISPLAY DEVICE

(71) Applicants: Hefei BOE Ruisheng Technology Co., Ltd., Anhui (CN); BOE TECHNOLOGY GROUP CO., LTD., Beijing (CN)

(72) Inventors: Chenyang Wang, Beijing (CN); Kangli Wang, Beijing (CN); Bing Zhang, Beijing (CN)

(73) Assignees: Hefei BOE Ruisheng Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/692,405

(22) PCT Filed: Aug. 26, 2022

(86) PCT No.: PCT/CN2022/115302
§ 371 (c)(1),
(2) Date: Mar. 15, 2024

(87) PCT Pub. No.: WO2024/040614
PCT Pub. Date: Feb. 29, 2024

(65) Prior Publication Data
US 2024/0288730 A1 Aug. 29, 2024

(51) Int. Cl.
*G02F 1/00* (2006.01)
*G02F 1/1335* (2006.01)
*G02F 1/13357* (2006.01)

(52) U.S. Cl.
CPC .. *G02F 1/133605* (2013.01); *G02F 1/133603* (2013.01); *G02F 1/133612* (2021.01)

(58) Field of Classification Search
CPC ......... G02F 1/133605; G02F 1/133612; G02F 1/133603
See application file for complete search history.

(56) References Cited

U.S. PATENT DOCUMENTS

| | | | | |
|---|---|---|---|---|
| 2015/0255739 A1* | 9/2015 | Kim | ..................... | H10K 59/131 428/192 |
| 2024/0178205 A1* | 5/2024 | Tang | ....................... | H01L 33/62 |
| 2024/0222549 A1* | 7/2024 | Chen | ................... | H01L 25/0753 |
| 2024/0407087 A1* | 12/2024 | Tang | .................... | H05K 1/0296 |

FOREIGN PATENT DOCUMENTS

| | | | | |
|---|---|---|---|---|
| CN | 102667315 A | | 9/2012 | |
| CN | 209373304 U | * | 9/2019 | ......... G02F 1/13357 |
| CN | 110908178 A | | 3/2020 | |

(Continued)

*Primary Examiner* — Gerald J Sufleta, II
(74) *Attorney, Agent, or Firm* — The Webb Law Firm

(57) ABSTRACT

A substrate includes a circuit board and a first reflective layer. The first reflective layer is disposed on the substrate. The first reflective layer has a central region and a peripheral region surrounding the central region. The first reflective layer includes at least one first buffer structure group, and an orthogonal projection of the first buffer structure group on the circuit board falls into the peripheral region. Each first barrier structure group includes a plurality of first slits spaced apart from each other, and a plurality of first slits in any first buffer structure group are disposed around the central region.

20 Claims, 10 Drawing Sheets

(56) References Cited

FOREIGN PATENT DOCUMENTS

| | | |
|---|---|---|
| CN | 211123565 U | 7/2020 |
| CN | 111752041 A | 10/2020 |
| CN | 113270437 A | 8/2021 |
| CN | 215896398 U | 2/2022 |
| CN | 216561305 U | 5/2022 |
| CN | 216817700 U | 6/2022 |
| JP | 2000082409 A | 3/2000 |
| JP | 2013118117 A | 6/2013 |
| WO | 2022227469 A1 | 11/2022 |

\* cited by examiner

SUBSTRATE, BACKLIGHT MODULE AND DISPLAY DEVICE

CROSS-REFERENCE TO RELATED APPLICATION

This application is the United States national phase of International Patent Application No. PCT/CN2022/115302, filed Aug. 26, 2022, the disclosure of which is hereby incorporated by reference in its entirety.

BACKGROUND OF THE INVENTION

Field of the Invention

The present disclosure relates to the field of display technologies, and in particular, to a substrate, a backlight module and a display device.

Description of Related Art

With the development of light-emitting diode technologies, the technology of using sub-millimeter or even micrometer level light-emitting diodes (LEDs) as a backlight source has been widely applied. Therefore, not only may contrast of an image of a product (e.g., liquid crystal display (LCD)) to which the backlight is applied reach a level of an organic light-emitting diode (OLED) display product, but also the product may retain technical advantages of the liquid crystal display (LCD). Thus, the display effect of the image may be improved, and a good visual experience may be provided for users.

SUMMARY OF THE INVENTION

In an aspect, a substrate is provided. The substrate includes a circuit board and a first reflective layer. The first reflective layer is disposed on the circuit board. The first reflective layer has a central region and a peripheral region surrounding the central region. The first reflective layer includes at least one first buffer structure group, and an orthogonal projection of the first buffer structure group on the circuit board falling into the peripheral region. Each first buffer structure group includes a plurality of first slits spaced apart from each other, and a plurality of first slits in any first buffer structure group are disposed around the central region.

In some embodiments, the at least one first buffer structure group includes a plurality of first buffer structure groups, any two adjacent first buffer structure groups have an interval therebetween, and centers of the plurality of first buffer structure groups coincide with a geometric center of the central region.

In some embodiments, in two adjacent first buffer structure groups, first slits in the two adjacent first buffer structure groups are disposed in a staggered manner in a direction perpendicular to a boundary of the central region and parallel to a plane where the circuit board is located.

In some embodiments, all first slits in the first buffer structure group are connected end to end in a clockwise or counterclockwise direction to be a first enclosed pattern. The first enclosed pattern has a first circumference, a first length accounts for at least ¼ of the first circumference, and the first length is a sum of lengths of the plurality of first slits in the first buffer structure group.

In some embodiments, the first reflective layer further includes at least one second buffer structure group, and an orthogonal projection of the second buffer structure group on the circuit board falling into the peripheral region. Each second buffer structure group includes at least one second slit extending in a direction perpendicular to a boundary of the central region; and in a case where the second buffer structure group includes a plurality of second slits, the plurality of second slits extend in a same direction and are spaced apart from each other.

In some embodiments, the at least one second buffer structure group includes a plurality of second buffer structure groups, the plurality of second buffer structure groups are disposed at intervals on a periphery of the central region of the first reflective layer, and second slits in two adjacent second buffer structure groups are disposed in a staggered manner.

In some embodiments, any second buffer structure group intersects with at least one first buffer structure group.

In some embodiments, the substrate further includes a plurality of electronic components. The substrate has a plurality of functional regions, and each functional region is provided thereon with multiple electronic components connected in series and/or in parallel. A first slit is located between two adjacent functional regions. The first reflective layer further includes at least one second buffer structure group, each second buffer structure group includes at least one second slit, and the second slit is located between two adjacent functional regions.

In some embodiments, an area of the peripheral region accounts for 15% to 25% of an area of a surface of the first reflective layer parallel to the circuit board.

In some embodiments, the substrate further includes a plurality of electronic components and a plurality of encapsulation portions. The plurality of electronic components are disposed on the circuit board. An encapsulation portion wraps at least one electronic component. The first reflective layer further includes a plurality of hollow regions and at least one third buffer structure group. An electronic component is located in a hollow region, and the encapsulation portion covers at least one hollow region. Each third buffer structure group includes a plurality of third slits spaced apart from each other, and a plurality of third slits in a third buffer structure group are disposed around the encapsulation portion.

In some embodiments, the at least one third buffer structure group includes a plurality of third buffer structure groups, at least two third buffer structure groups are disposed around the same encapsulation portion, and in the at least two third buffer structure groups, any two adjacent third buffer structure groups have an interval therebetween.

In some embodiments, centers of the at least two third buffer structure groups disposed around the same encapsulation portion coincide with a geometric center of the encapsulation portion.

In some embodiments, in two adjacent third buffer structure groups, third slits in the two adjacent third buffer structure groups are disposed in a staggered manner in a direction perpendicular to a boundary of the hollow region and parallel to a plane where the circuit board is located.

In some embodiments, all third slits in each third buffer structure group are connected end to end in a clockwise or counterclockwise direction to be a second enclosed pattern. An outer boundary of an orthogonal projection of the encapsulation portion on the circuit board constitutes a third enclosed pattern. An outer boundary of an orthogonal projection of the hollow region on the circuit board constitutes a fourth enclosed pattern. At least two of the second enclosed pattern, the third enclosed pattern and the fourth enclosed pattern are similar figures to each other.

In some embodiments, the second enclosed pattern and the third enclosed pattern are each in a shape of a circle. A ratio of a diameter of a second enclosed pattern corresponding to a third buffer structure group closest to the encapsulation portion to a diameter of the encapsulation portion is greater than 1 and less than or equal to 1.2. And/or, at least two third buffer structure groups are disposed around the same encapsulation portion, and in the at least two third buffer structure groups, a ratio of a difference between diameters of two second enclosed patterns corresponding to any two adjacent third buffer structure groups to the diameter of the encapsulation portion is greater than 0 and less than or equal to 0.2.

In some embodiments, the second enclosed pattern is in a shape of a polygon, and the third enclosed pattern is in a shape of a circle. A ratio of a length of a diagonal of a second enclosed pattern corresponding to a third buffer structure group closest to the encapsulation portion to a diameter of the encapsulation portion is greater than 1 and less than or equal to 1.2. And/or, at least two third buffer structure groups are disposed around the same encapsulation portion, and in the at least two third buffer structure groups, a ratio of a difference between lengths of diagonals of two second enclosed patterns corresponding to any two adjacent third buffer structure groups to the diameter of the encapsulation portion is greater than 0 and less than or equal to 0.2.

In some embodiments, all third slits in the third buffer structure group are connected end to end in a clockwise or counterclockwise direction to be a second enclosed pattern. The second enclosed pattern has a second circumference, a second length accounts for at least ¼ of the second circumference, and the second length is a sum of lengths of the plurality of third slits in the third buffer structure group.

In some embodiments, a length of a first slit is approximately in a range of 1.9 mm to 2.1 mm, and a width of the first slit is approximately in a range of 0.02 mm to 0.08 mm. The first reflective layer further includes at least one second buffer structure group, each second buffer structure group includes at least one second slit, a length of a second slit is approximately in a range of 1.9 mm to 2.1 mm, and a width of the second slit is approximately in a range of 0.02 mm to 0.08 mm. The first reflective layer further includes at least one third buffer structure group, each third buffer structure group includes a plurality of third slits, a length of a third slit is approximately in a range of 1.9 mm to 2.1 mm, and a width of the third slit is approximately in a range of 0.02 mm to 0.08 mm.

In some embodiments, the first reflective layer further includes a plurality of hollow regions. The substrate further includes a plurality of electronic components and a second reflective layer. The plurality of electronic components are disposed on the circuit board, an electronic component is located in a hollow region. The second reflective layer is disposed between the first reflective layer and the circuit board. The second reflective layer is provided with a plurality of openings therein. The electronic component is located in an opening, and the opening is located in the hollow region.

In some embodiments, in a direction perpendicular to a boundary of the electronic component and parallel to a plane where the circuit board is located, a ratio of a length of the electronic component to a length of the opening is in a range of 0.50 to 0.70. And/or, in a direction perpendicular to a boundary of the opening and parallel to the plane where the circuit board is located, a ratio of the length of the opening to a length of the hollow region is in a range of 0.15 to 0.3.

In another aspect, a backlight module is provided. The backlight module includes the substrate as described in any of the above embodiments and a plurality of optical films. The substrate has a light-emitting surface and a non-light-emitting surface that are opposite, and the plurality of optical films are disposed on the light-emitting surface of the substrate.

In yet another aspect, a display device is provided. The display device includes the backlight module as described in the above embodiment and a display panel. The display panel is disposed on a side of the plurality of optical films in the backlight module away from the substrate.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DESCRIPTION OF THE INVENTION

Figure 1:
FIG. 1 is a structural diagram of a display device, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The phrase "applicable to" or "configured to" as used herein indicates an open and inclusive expression, which does not exclude device that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

Referring to FIG. 1, some embodiments of the present disclosure provide a display device 1000. The display device 1000 may be any device that displays images whether in motion (such as a video) or fixed (such as a still image), and regardless of text or image.

For example, the display device 1000 may be any product or component having a display function, such as a television, a notebook computer, a tablet computer, a mobile phone, a personal digital assistant (PDA), a navigator, a wearable device, an augmented reality (AR) device, or a virtual reality (VR) device.

In some embodiments, the display device 1000 may be a liquid crystal display device.

Figure 2:
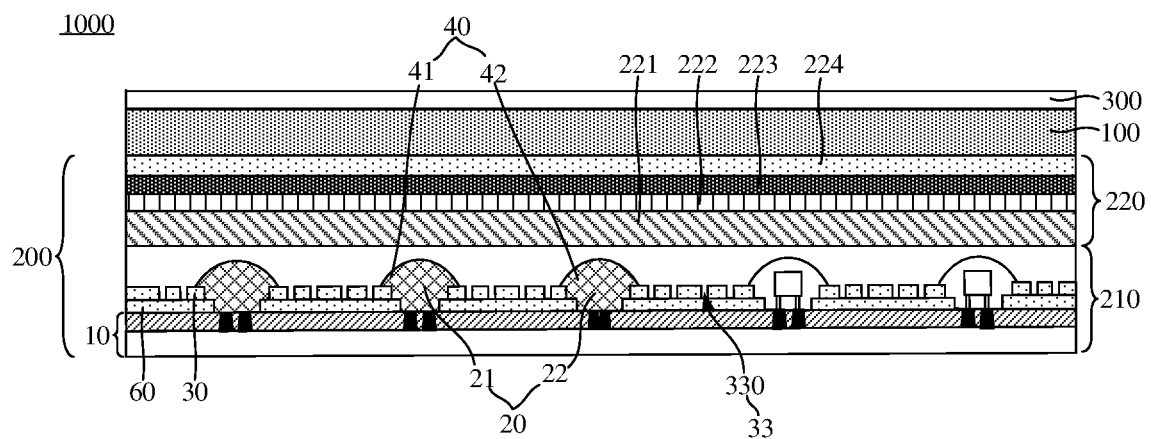
FIG. 2 is a sectional view of a display device, in accordance with some embodiments.

As shown in FIG. 2, the display device 1000 may include a display panel 100, a backlight module 200 and a cover plate 300.

The display panel 100 includes a light-exit surface and a non-light-exit surface that are opposite. The light-exit surface refers to a surface of the display panel 100 for displaying an image (an upper surface of the display panel 100 in FIG. 2), and the non-light-exit surface refers to another surface (a lower surface of the display panel 100 in FIG. 2) opposite to the light-exit surface.

The backlight module 200 is disposed on the non-light-exit surface of the display panel 100, and the backlight module 200 is used for providing a light source for the display panel 100.

The cover plate 300 is disposed on a light-exit surface of the display panel 100, and the cover plate 300 is used for protecting the display panel 100. For example, the material of the cover plate 300 may select a rigid material such as glass, quartz, or plastic, or may select a flexible material such as polymer resin.

In some examples, with continued reference to FIG. 2, the backlight module 200 may include a substrate 210 and a plurality of optical films 220.

The substrate 210 has a light-emitting surface and a non-light-emitting surface that are opposite. The light-emitting surface refers to a surface of the substrate 210 for providing a light source (an upper surface of the substrate 210 in FIG. 2), and the non-light-emitting surface refers to the other surface opposite to the light-emitting surface (a lower surface of the substrate 210 in FIG. 2).

The plurality of optical films 220 are disposed on the light-emitting surface of the substrate 210.

The substrate 210 may emit white light directly, and the white light is performed light uniformizing treatment by the plurality of optical films 220 and then irradiated towards the display panel 100. Alternatively, the substrate 210 may emit light of another color (e.g., blue light), and the light is performed color conversion and light uniformizing treatment by the plurality of optical films 220 and then irradiated towards the display panel 100.

For example, referring to FIG. 2, the plurality of optical films 2 includes a diffusion plate 221, a quantum dot film 222, a diffusion sheet 223 and a composite film 224 that are disposed in sequence in a direction away from the substrate 210.

The diffusion plate 221 is capable of blurring the light emitted by the substrate 210 and providing support for the quantum dot film 222, the diffusion sheet 223 and the composite film 224. The quantum dot film 222 may, under excitation of light of a certain color emitted by the substrate 210, convert the light into white light, so as to improve a utilization rate of light energy of the substrate 210. The diffusion sheet 223 is capable of performing uniformizing treatment on the light passing through the diffusion sheet 223. The composite film 224 is capable of improving the light extraction efficiency of the backlight module 200 and improving the display brightness of the display device 1000.

It will be noted that the composite film 224 may include a brightness enhancement film (BEF) and a reflective polarized brightness enhancement film (also referred to as a dual brightness enhancement film, DBEF), which utilizes principles of total reflection, refraction and polarization to increase the light flux within a certain angle range, thereby increasing the brightness of the display device 1000.

For example, the substrate 210 emits blue light in a direction away from the substrate 210. The quantum dot film 222 may include a red quantum dot material, a green quantum dot material, and a transparent material. The blue light emitted by the substrate 210 is converted into red light when passing through the red quantum dot material, the blue light is converted into green light when passing through the green quantum dot material, and the blue light may pass through the transparent material directly. The blue light, the red light and the green light are mixed in a certain proportion to appear as white light. Then, the diffusion plate 221 and the diffusion sheet 223 are capable of mixing the white light evenly to improve the light shadow generated by the substrate 210 and enhance the display quality of the display device 1000.

Figure 3:
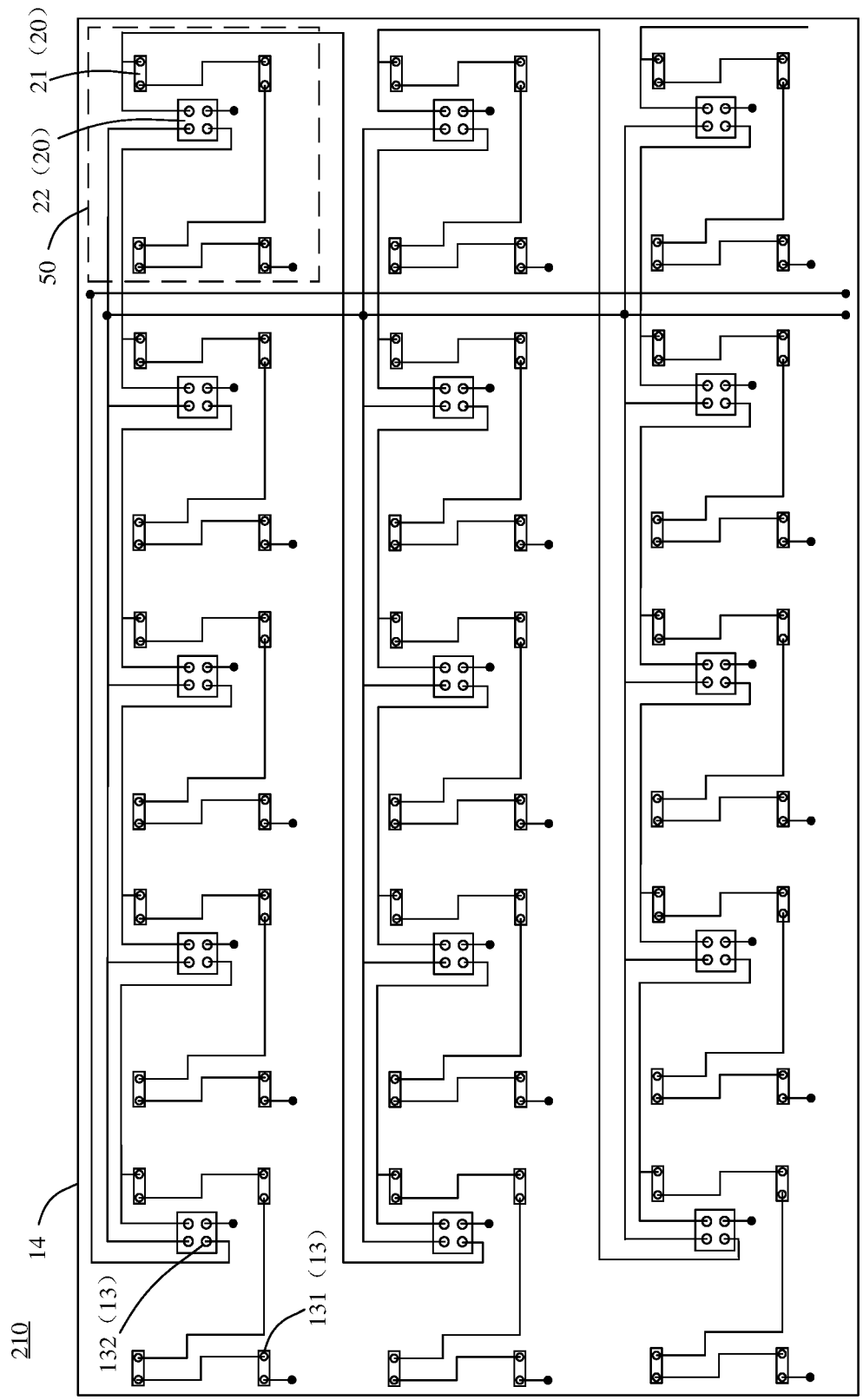
FIG. 3 is an equivalent circuit diagram of a substrate, in accordance with some embodiments.
Figure 7:
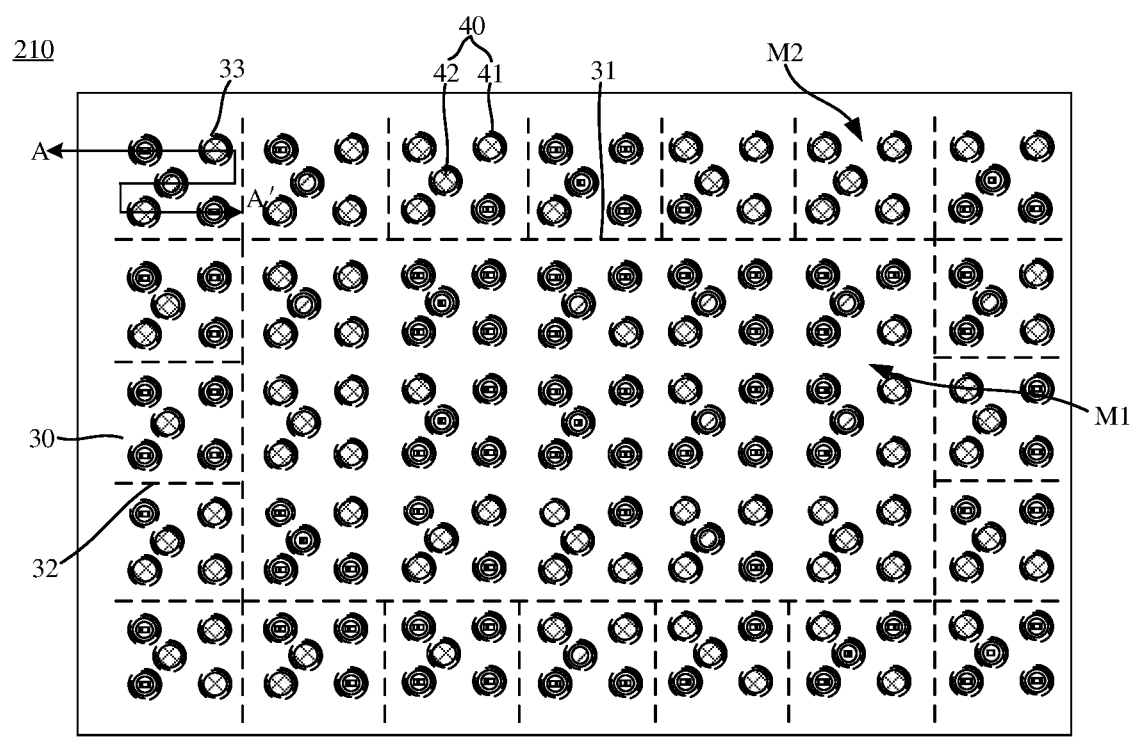
FIG. 7 is a top view of a substrate, in accordance with some embodiments.
Figure 8:
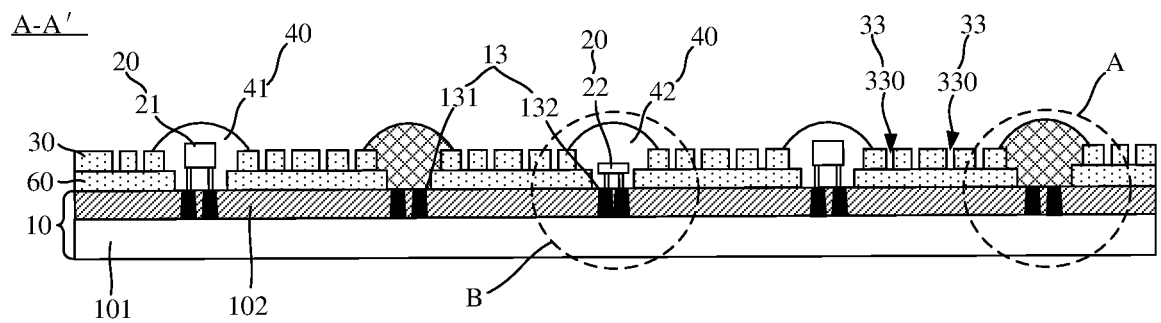
FIG. 8 is a sectional view taken along a line A-A' in FIG. 7.

In some embodiments, referring to FIGS. 3, 7 and 8, the substrate 210 includes a circuit board 10, a plurality of electronic components 20, a first reflective layer 30 and encapsulation portions 40.

In some examples, the circuit board 10 may be an FR4 type printed circuit board (PCB), or may be a flexible PCB prone to deformation. For example, the material of the circuit board 10 may include one or more of ceramic materials such as silicon nitride, aluminium nitride (AlN), and $Al_2O_3$, or may include metal or a metal compound, such as a metal core printed circuit board (metal core PCB) or metal copper clad laminate (MCCL).

In other examples, as shown in FIGS. 7 and 8, the circuit board 10 includes a substrate 101 and at least one conductive layer 102 disposed on the substrate 101.

The substrate 101 may adopt any one of substrates including a glass substrate, a quartz substrate, a sapphire substrate and a ceramic substrate; or any one of semiconductor substrates such as a single crystal semiconductor substrate made of silicon or silicon carbide or a polycrystalline semiconductor substrate made of silicon or silicon carbide, compound semiconductor substrates of silicon and germanium, and silicon on insulator (SOI). The substrate 101 may also adopt a film layer made of organic resin materials such as one or more of epoxy resin, triazine, silicone resin and polyimide.

The materials of the conductive layer(s) 102 include one or more of copper, molybdenum-niobium alloy (MoNb), nickel, and indium tin oxide.

Referring to FIGS. 3 and 8, the circuit board 10 may include pads 13 and circuit traces 14. The pads 13 are configured to connect electronic components 20, and the circuit traces 14 are configured to connect different pads 13 or transmit signals.

It will be noted that the pads 13 and the circuit traces 14 may be, for example, located in the above conductive layer(s) 102.

As shown in FIGS. 3 and 8, the plurality of electronic components 20 are provided on the circuit board 10, and the electronic components 20 may include light-emitting devices 21 and microchips 22.

As shown in FIG. 3, the light-emitting devices 21 may include one or more of micro light-emitting diodes (micro LEDs) and mini light-emitting diode (mini LEDs).

It will be noted that a size (e.g., a length) of the micro LED is less than 50 microns, for example, in a range of 10 microns to 50 microns; and a size (e.g., a length) of the mini LED is in a range of 50 microns to 150 microns, for example, in a range of 80 microns to 120 microns. In the embodiments of the present disclosure, different light-emitting devices 21 may be provided according to actual needs.

As shown in FIG. 3, the microchips 22 may include sensing chips and driver chips. The sensing chip may be, for example, a light-sensitive sensor chip or a thermosensitive sensor chip. The driver chip is used to provide driving signals for the light-emitting devices 21. For example, FIG. 3 only shows an example of the microchips 22 including the driver chips.

On this basis, referring to FIGS. 3 and 8, the pads 13 includes first pads 131 and second pads 132. A light-emitting device 21 is electrically connected to the circuit board 10 by two first pads 131, and a microchip 22 is electrically connected to the circuit board 10 by four second pads 132.

As shown in FIG. 8, the first reflective layer 30 is disposed on the circuit board 10, and the first reflective layer 30 is configured to reflect the light emitted by the light-emitting devices 21 towards the circuit board 10, so that more light emitted by the light-emitting devices 21 is irradiated towards the display panel 100 (referring to FIG. 2), thereby improving the light extraction efficiency of the substrate 210 and improving the display effect.

Figure 4:
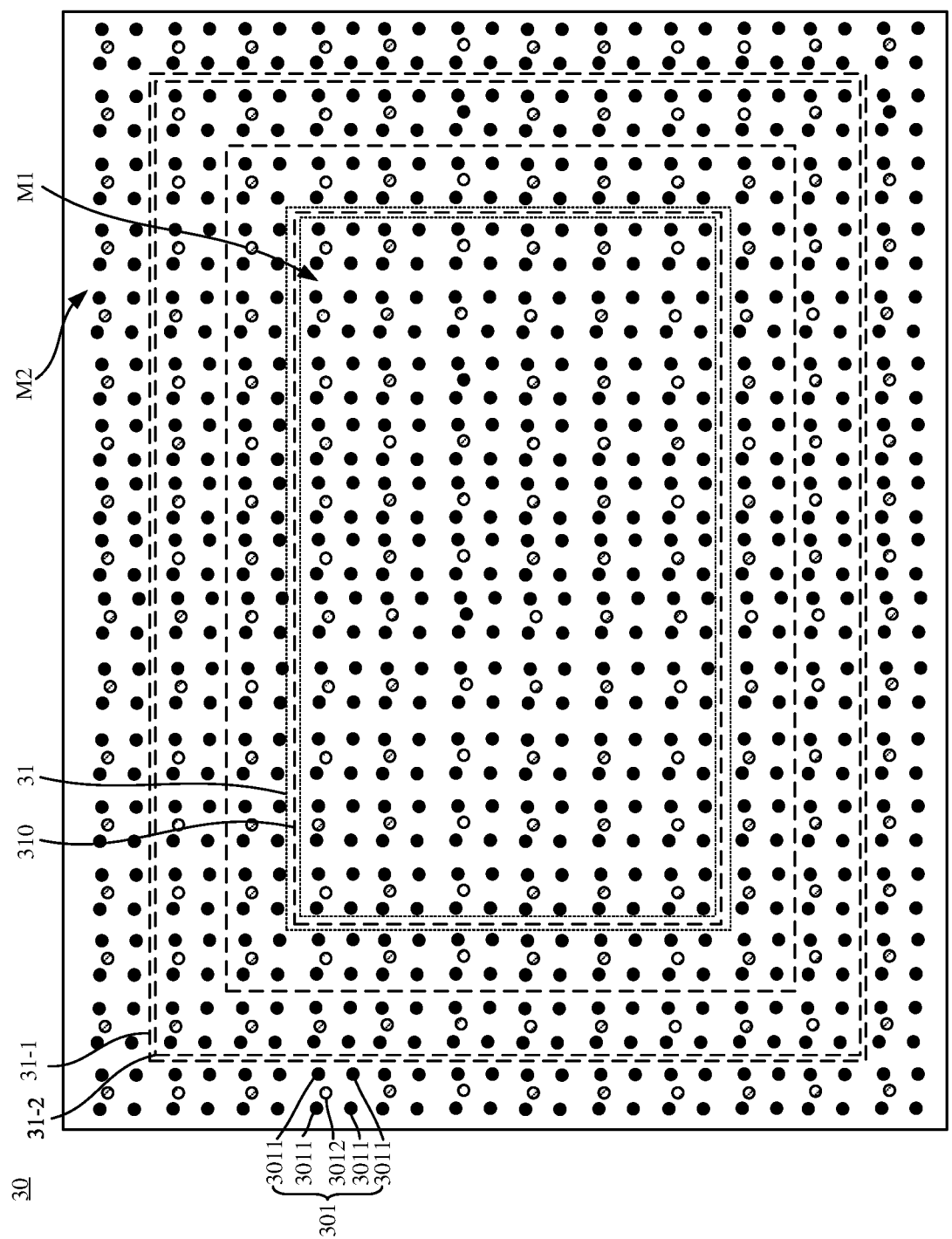
FIG. 4 is a top view of a first reflective layer, in accordance with some embodiments.

It will be noted that the material of the first reflective layer 30 includes polyester material, which has relatively high reflectivity, and results in a relatively good image effect and a relatively low power consumption. For example, the material of the first reflective layer 30 includes a polymer obtained by polycondensation of polyol and polybasic acid. For example, the material of the first reflective layer 30 includes at least one of linear thermoplastic resins such as polyethylene terephthalate, polybutylene terephthalate and polyarylester. An adhesive layer is provided on a surface of the first reflective layer facing the circuit board, and the first reflective layer is attached and fixed to the circuit board by attaching. Referring to FIGS. 4 and 8, the first reflective layer 30 is provided with a plurality of hollow regions 301 therein, and a plurality of pads 13 are provided in a hollow region 301. An electronic component 20 is located in a hollow region 301, that is, an electronic component 20 passes through the hollow region 301 to be electrically connected to the pads 13 in the circuit board 10.

It will be noted that an outline of an orthogonal projection of the hollow region 301 on the circuit board 10 may be in a shape of a circle, a polygon, or the like, which is not specifically limited in the embodiments of the present disclosure. FIG. 4 shows an example where the outline of the orthogonal projection of the hollow region 301 on the circuit board 10 is in a shape of a circle for illustration.

A maximum size of the hollow region 301 is less than or equal to 2.5 mm. For example, the outline of the orthogonal projection of the hollow region 301 on the circuit board 10 is in a shape of a circle, and a bore diameter of the hollow region 301 is in a range of 1.4 mm to 1.6 mm.

In this case, the bore diameter of the hollow region 301 is small, so that more light emitted by the light-emitting devices 21 is irradiated towards the display panel 100, thereby improving the light extraction efficiency of the substrate 210 and improving the display effect. Moreover, the first reflective layer 30 may be compatible with a display device in which electronic components 20 (e.g., the light-emitting devices 21) have a small distance therebetween, that is, compatible with a display device 1000 with a high pixel density.

Figure 9A:
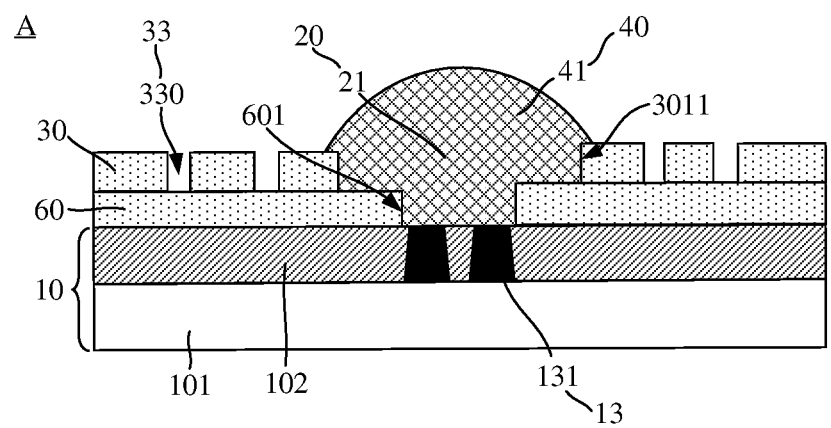
FIG. 9A is a partial enlarged view of a circle A in FIG. 8.

In some embodiments, referring to FIGS. 4 and 9A, the electronic components 20 include a light-emitting device 21, the hollow regions 301 include a first hollow region 3011, and two first pads 131 are provided in the first hollow region 3011. A light-emitting device 21 corresponds to a first hollow region 3011, and two pins of the light-emitting device 21 are electrically connected to the two first pads 131, respectively.

Figure 9B:
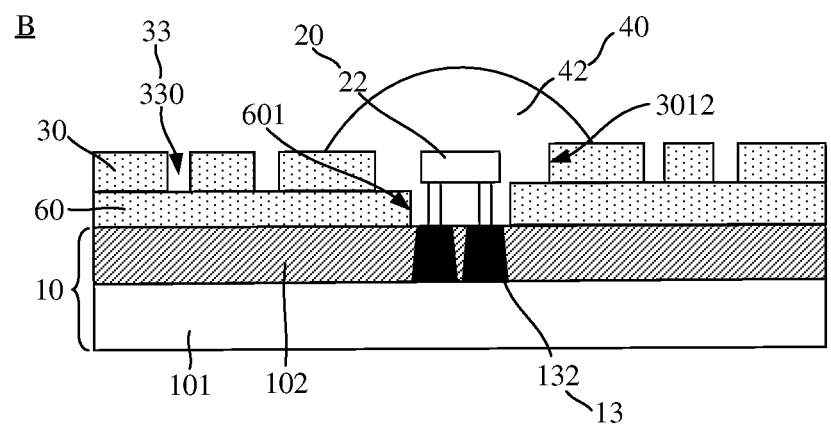
FIG. 9B is a partial enlarged view of a circle B in FIG. 8.

In some embodiments, referring to FIGS. 4 and 9B, the electronic components 20 include a microchip 22, the hollow regions 301 include a second hollow region 3012, and four second pads 132 are also provided in the second hollow region 3012. A microchip 22 corresponds to a second hollow region 3012, and four pins of the microchip 22 are electrically connected to the four second pads 132, respectively.

It will be noted that sizes of the first hollow region 3011 and the second hollow region 3012 may be the same or different.

For example, the size of the hollow region 301 is positively related to the size of the corresponding electronic component 20, and the shape of the hollow region 301 is similar to the shape of the outline of the orthogonal projection of the corresponding electronic component 20 on the circuit board 10.

For example, the shape of the first hollow region 3011 is similar to the shape of the outline of the orthogonal projection of the light-emitting device 21 on the circuit board 10, and the shape of the second hollow region 3012 is similar to the shape of the outline of the orthogonal projection of the microchip 22 on the circuit board 10.

Some embodiments of the present disclosure are illustrated below by considering an example where the first hollow region 3011 and the second hollow region 3012 have the same sizes.

As shown in FIG. 8, an encapsulation portion 40 wraps at least an electronic component 20.

It will be noted that the shape of the encapsulation portion 40 may be a hemisphere, a semi-ellipsoid, or the like, which is not specifically limited in the embodiments of the present disclosure. For example, high thixotrope may be sprayed onto the hemispherical encapsulation portion 40 formed on the electronic component 20 by a dispenser.

Depending on different electronic component 20, the materials of the encapsulation portions 40 may be the same or different. For example, the electronic component 20 is an optical component, and the encapsulation portion 40 is made of a transparent material. The electronic component 20 is a non-optical component, and the material of the encapsulation portion 40 has no requirements for light transmission, and may select a transparent material, a reflective material, or a light-absorbing material.

In some examples, as shown in FIG. 9A, the electronic components 20 include a light-emitting device 21, and the encapsulation portions 40 include a first encapsulation portion 41 that wraps the light-emitting device 21. The material of the first encapsulation portion 41 is a transparent material, and the transparent material may include transparent silicone.

In some examples, as shown in FIG. 9B, the electronic components 20 include a microchip 22, and the encapsulation portions 40 include a second encapsulation portion 42 that wraps the microchip 22. The second encapsulation portion 42 may be made of a transparent material to save processes. Alternatively, the second encapsulation portion 42 may be made of a reflective material, and the reflective material may include at least one of white ink, white resin, and silicone white adhesive. Alternatively, the second encapsulation portion 42 may be made of a light-absorbing material, and the light-absorbing material may include at least one of black ink, black resin, and silicone black adhesive.

In some embodiments, an encapsulation portion 40 covers at least a hollow region 301. In this case, the encapsulation portion 40 covers the hollow region 301 in the first reflective layer 30, so that the electronic component 20 in the hollow region 301 may be protected, which is beneficial to improving the waterproofness and corrosion resistance of the substrate 210 and improving the light extraction efficiency of the substrate 210.

However, in the related art, in the reliability evaluation test of the product, the substrate is stored for 1000 H at a temperature of 85° C. and a humidity of 85%. Since the thermal expansion coefficient of the first reflective layer is different from that of the circuit board, the first reflective layer has different expansion and contraction from the circuit board, so that the first reflective layer contracts from the periphery to the center relative to the circuit board, the encapsulation portion is subjected to a pull force from the first reflective layer, and displacement at an edge of the circuit board accumulates, resulting in warping of the circuit board.

In addition, in a case where the pull force applied to the encapsulation portion reaches a sum of friction between the encapsulation portion and the circuit board and resistance between the encapsulation portion and the electronic component, the encapsulation portion will crack and peel off from the substrate. Moreover, the encapsulation portion will generate a thrust force on the electronic component wrapped thereby. In a case where the thrust force is greater than or equal to the resistance of the electronic component, the electronic component will fall off from the pads, thereby causing the adverse risk of the light-emitting device not lighting.

In order to improve the above technical problem, as shown in FIG. 4, the first reflective layer 30 includes a central region M1 and an peripheral region M2 surrounding the central region M1.

It will be noted that an area of the peripheral region M2 accounts for 15% to 25% of an area of a surface of the first reflective layer parallel to the circuit board. For example, in directions parallel to a plane where the circuit board 10 is located, a dimension of the peripheral region M2 in a direction parallel to an edge of the first reflective layer 30 accounts for 5% to 15% of a dimension of the edge.

The peripheral region M2 of the first reflective layer 30 includes at least one first buffer structure group 31, and an orthogonal projection of the first buffer structure group 31 on the circuit board 10 falls into the peripheral region M2.

Figure 11:
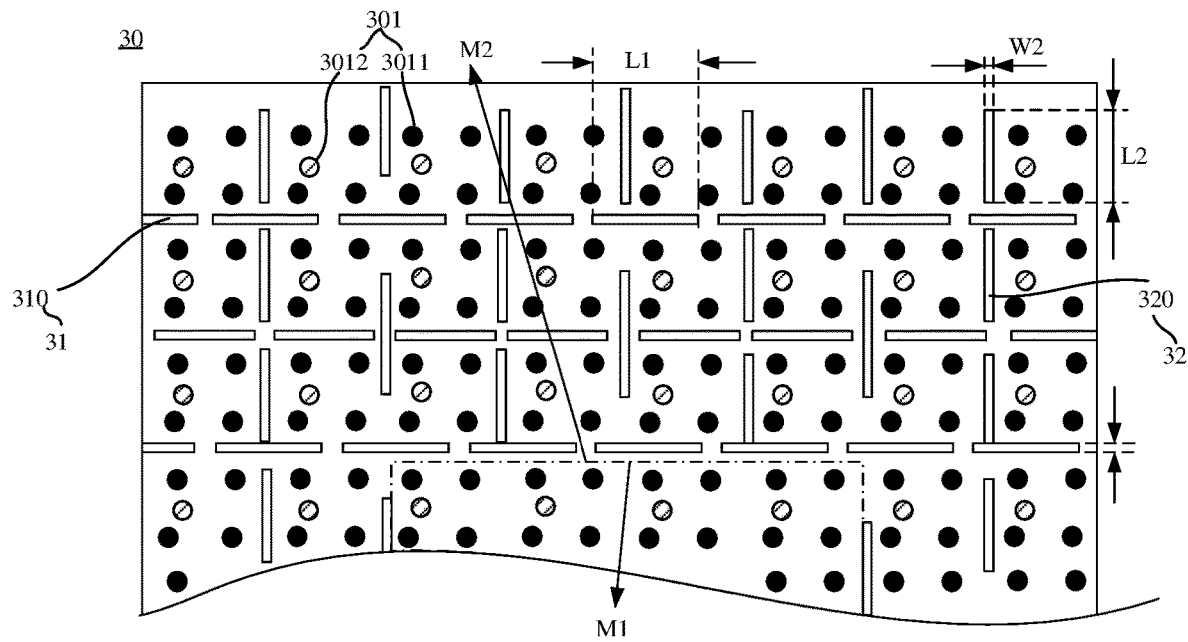
FIG. 11 is a partial enlarged view of a first reflective layer, in accordance with some embodiments.

Here, as shown in FIGS. 4 and 11, each first buffer structure group 31 includes a plurality of first slits 310, the plurality of first slits 310 in each first buffer structure group 31 are spaced apart from each other, and the plurality of first slits 310 in any first buffer structure group 31 are arranged around the central region M1.

In this case, both the central region M1 and the peripheral region M2 of the first reflective layer 30 may contract and deform at the plurality of first slits 310 of the first buffer structure group 31, so that the stress of the first reflective layer 30 is dispersed, thereby reducing the displacement accumulation at the peripheral region M2 of the first reflective layer 30. As a result, the tendency of relative movement between the peripheral region M2 of the first reflective layer 30 and the circuit board 10 is weakened, thereby reducing the stretching of the peripheral region M2 of the first reflective layer 30 to the circuit board 10, and reducing the warping degree of the circuit board 10 (the substrate 210).

In addition, the tendency of relative movement between the peripheral region M2 of the first reflective layer 30 and the circuit board 10 is weakened, which may further reduce the risk of cracking of the encapsulation portion 40 located in the peripheral region M2, further reduce the risk of the encapsulation portion 40 located in the peripheral region M2 peeling off from the circuit board 10, and moreover, further reduce the thrust force applied by the encapsulation portion 40 located in the peripheral region M2 to the electronic component wrapped by the encapsulation portion 40, thereby reducing the adverse risk of not lighting of the light-emitting device 21 on the substrate 210.

The shape of the first slit 310 may be a regular shape such as a circle, a sector ring or a rectangle, or may be an irregular shape.

For example, the shape of the first slit 310 is substantially a rectangle or a sector ring.

For example, as shown in FIG. 11, in a case where the shape of the first slit 310 is substantially a rectangle, long sides of the rectangle extend along the circumferential direction of the central region M1.

Figure 12:
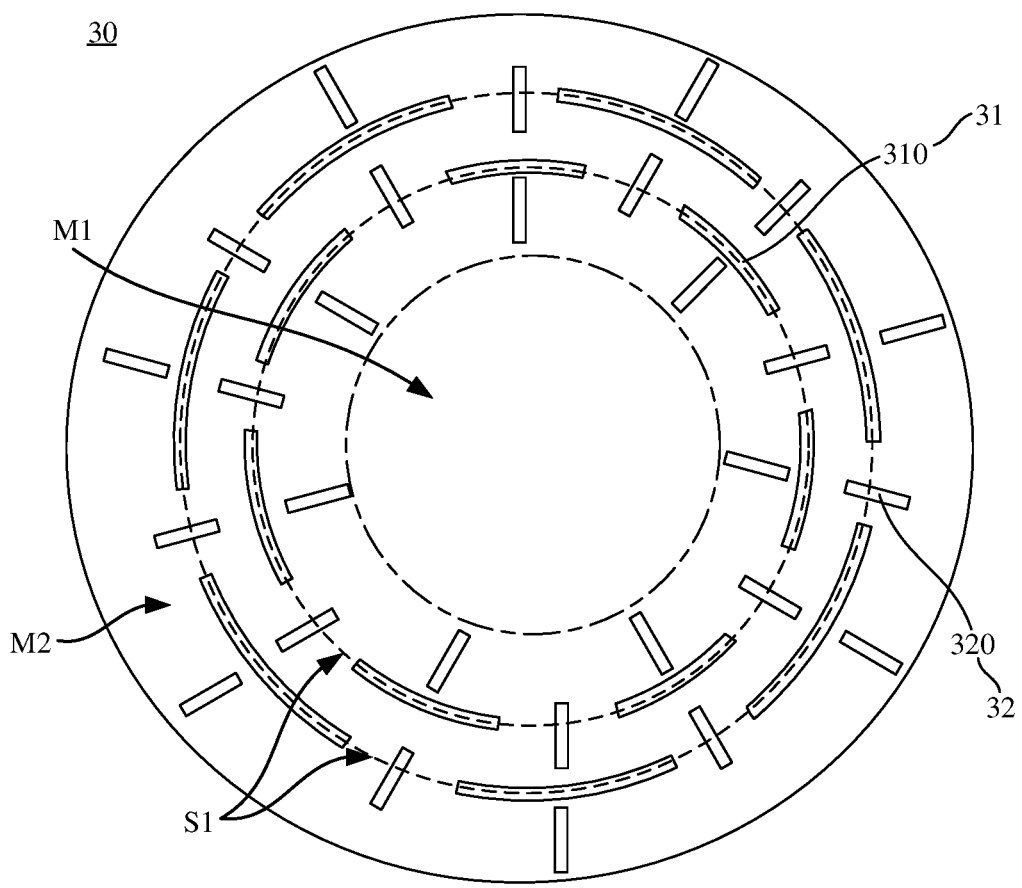
FIG. 12 is a top view of yet another first reflective layer, in accordance with some embodiments.

As another example, as shown in FIG. 12, in a case where the shape of the first slit 310 is substantially a sector ring, arc edges of the sector ring extend along the circumferential direction of the central region M1.

Referring to FIG. 11, a length L1 of the first slit 310 is approximately in a range of 1.9 mm to 2.1 mm, and a width W1 of the first slit 310 is approximately in a range of 0.02 mm to 0.08 mm. For example, the length L1 of the first slit 310 is approximately any one of 1.9 mm, 2.0 mm or 2.1 mm, and the width W1 of the first slit 310 is approximately any one of 0.02 mm, 0.03 mm, 0.04 mm, 0.05 mm, 0.06 mm, 0.07 mm or 0.08 mm.

It will be noted that in the text, in a case where the shape of the first slit 310 is substantially a sector ring, the length of the first slit 310 refers to a length of the arc edge of the sector ring.

In the above first buffer structure group 31, a ratio of an extension length of each first slit 310 to a distance between two adjacent first slits 310 is not unique.

For example, referring to FIG. 12, all first slits 310 in the first buffer structure group 31 are connected end to end in a clockwise or counterclockwise direction to form a first enclosed pattern S1. The first enclosed pattern S1 has a first circumference, the first length accounts for at least ¼ of the first circumference, and the first length is a sum of the lengths of the plurality of first slits 310 in the first buffer structure group 31.

In this way, a buffer zone formed by the plurality of first slits 310 in the first buffer structure group 31 has an obvious buffering effect, and the plurality of first slits 310 have a great structural strength and a small risk of breakage.

In some embodiments, as shown in FIGS. 4, 11 and 12, the first reflective layer 30 includes a plurality of first buffer structure groups 31, and any two adjacent first buffer structure groups 31 have an interval therebetween. With such provision, a plurality of buffer zones may be formed on the periphery of the central region M1. It can be understood that in some embodiments, an interval between two adjacent first buffer structure groups 31 may be a positive integer multiple of a size of a functional region. For example, the two adjacent first buffer structure groups 31 are arranged at an interval with a width of a functional region therebetween. In some embodiments, the interval between the two adjacent first buffer structure groups 31 (e.g., 31-1 and 31-2 in FIG. 4) may have a value ranging from 0.5 mm to 2.5 mm, such as 0.8 mm or 1 mm. In some embodiments, the two adjacent first buffer structure groups 31 may be arranged at an interval with another regular.

That is, the stress of the peripheral region M2 of the first reflective layer 30 is dispersed uniformly, which may further reduce the displacement accumulation at the peripheral region M2 of the first reflective layer 30. As a result, the tendency of relative movement between the peripheral region M2 of the first reflective layer 30 and the circuit board 10 is weakened, thereby reducing the stretching of the peripheral region M2 of the first reflective layer 30 to the circuit board 10, and reducing the warping degree of the circuit board 10 (the substrate 210).

Moreover, under the buffering effect of the plurality of buffer zones formed by the plurality of first buffer structure groups 31, the risk of cracking of the encapsulation portion 40 located in the peripheral region M2 may further be reduced, and the adverse risk of not lighting of the light-emitting device 21 located in the peripheral region M2 of the substrate 210 may further be reduced.

In addition, centers of the plurality of first buffer structure groups 31 coincide with a geometric center of the central region M1, so that the plurality of buffer zones formed by the plurality of first buffer structure groups 31 have approximately equal distance therebetween. Therefore, the pull force applied to portions of the peripheral region M2 of the first reflective layer 30 located between the buffer zones is dispersed uniformly, thereby avoiding the risk of cracking caused by excessively large pull force applied to a part of portions of the peripheral region M2 of the first reflective layer 30 located between the buffer zones.

On this basis, as shown in FIGS. 11 and 12, in the two adjacent first buffer structure groups 31, in a direction perpendicular to a boundary of the central region M1 and parallel to the plane where the circuit board 10 (referring to FIG. 8) is located, first slits 310 in the two adjacent first buffer structure groups 31 are arranged in a staggered manner.

In this way, for the plurality of buffer zones formed by the first buffer structure groups 31 in the peripheral region M2, the buffer region thereof may form a complete enclosed pattern, so that the peripheral region M2 of the first reflective layer 30 may be buffered by the buffer zones in any direction parallel to the plane where the circuit board 10 is located, thereby avoiding the risk of cracking of the encapsulation portion 40 caused by excessively large pull force applied to a part of the peripheral region M2 of the first reflective layer 30 caused by a lack of buffering effect of the buffer zones in the local region of the peripheral region M2 of the first reflective layer 30, which is beneficial to improving the waterproofness and corrosion resistance of the substrate 210.

Figure 5:
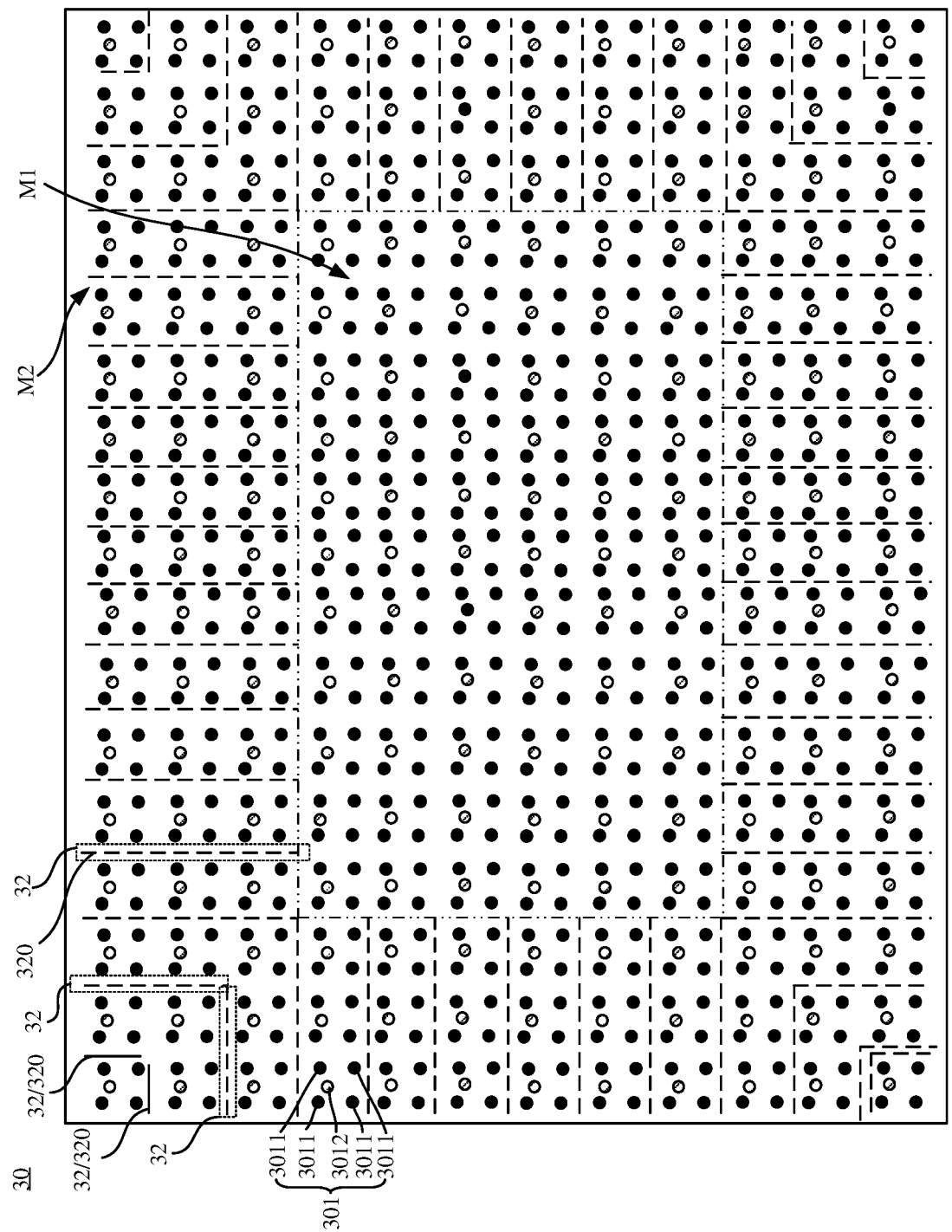
FIG. 5 is a top view of another first reflective layer, in accordance with some embodiments.

In some embodiments, as shown in FIG. 5, the peripheral region M2 of the first reflective layer 30 further includes at least one second buffer structure group 32, and an orthogonal projection of the second buffer structure group 32 on the circuit board 10 (referring to FIG. 8) falls into the peripheral region M2.

Here, as shown in FIGS. 5, 11 and 12, each second buffer structure group 32 includes a plurality of second slits 320 that are spaced apart from each other. The plurality of second slits 320 in any second buffer structure group 32 are arranged at intervals in a direction perpendicular to the boundary of the central region M1. Each second buffer structure group 32 includes at least one second slit 320 extending in the direction perpendicular to the boundary of the central region M1. That is, referring to FIG. 12, the extending direction of the second slit 320 is substantially perpendicular to a side of the first enclosed pattern S1 formed by the first buffer structure groups 31.

In a case where the second buffer structure group 32 includes a plurality of second slits 320, the plurality of second slits 320 extend in the same direction and are arranged at intervals. As shown in FIG. 5, for example, the second buffer structure group 32 provided at a corner position of the first reflective layer 30 may include only one second slit 320, while the second buffer structure group 32 provided at a non-corner position may include a plurality of second slits 320 extending in the same direction and spaced apart in the direction.

In this case, the peripheral region M2 of the first reflective layer 30 may contract and deform at the plurality of second slits 320 of the second buffer structure group 32, so that the stress of the first reflective layer 30 is more dispersed, thereby further reducing the stretching of the peripheral region M2 of the first reflective layer 30 to the circuit board 10, reducing the warping degree of the circuit board 10 (the substrate 210), further reducing the risk of cracking of the encapsulation portion 40 located in the peripheral region M2, and further reducing the adverse risk of not lighting of the light-emitting device 21 located in the peripheral region M2 of the substrate 210.

The shape of the second slit 320 may be a regular shape such as a circle or a rectangle, or may be an irregular shape.

For example, as shown in FIGS. 11 and 12, the shape of the second slit 320 is substantially a rectangle, and long sides of the rectangle extend along a direction perpendicular to the boundary of the central region M1.

Referring to FIG. 11, a length L2 of the second slit 320 is approximately in a range of 1.9 mm to 2.1 mm, and a width W2 of the second slit 320 is approximately in a range of 0.02 mm to 0.08 mm. For example, the length L2 of the second slit 320 is approximately any one of 1.9 mm, 2.0 mm, or 2.1 mm, and the width W2 of the second slit 320 is approximately any one of 0.02 mm, 0.03 mm, 0.04 mm, 0.05 mm, 0.06 mm, 0.07 mm or 0.08 mm.

In the above second buffer structure group 32, a ratio of an extension length of each second slit 320 to a distance between two adjacent second slits 320 is not unique.

For example, referring to FIGS. 11 and 12, in the second buffer structure group 32, a ratio of the length of the second slit 320 to a distance between two adjacent second slits 320 is in a range of 1 to 3.

In this way, a buffer zone formed by the plurality of second slits 320 in the second buffer structure group 32 has an obvious buffering effect, and the plurality of second slits 320 have a great structural strength and a small risk of breakage.

Figure 6:
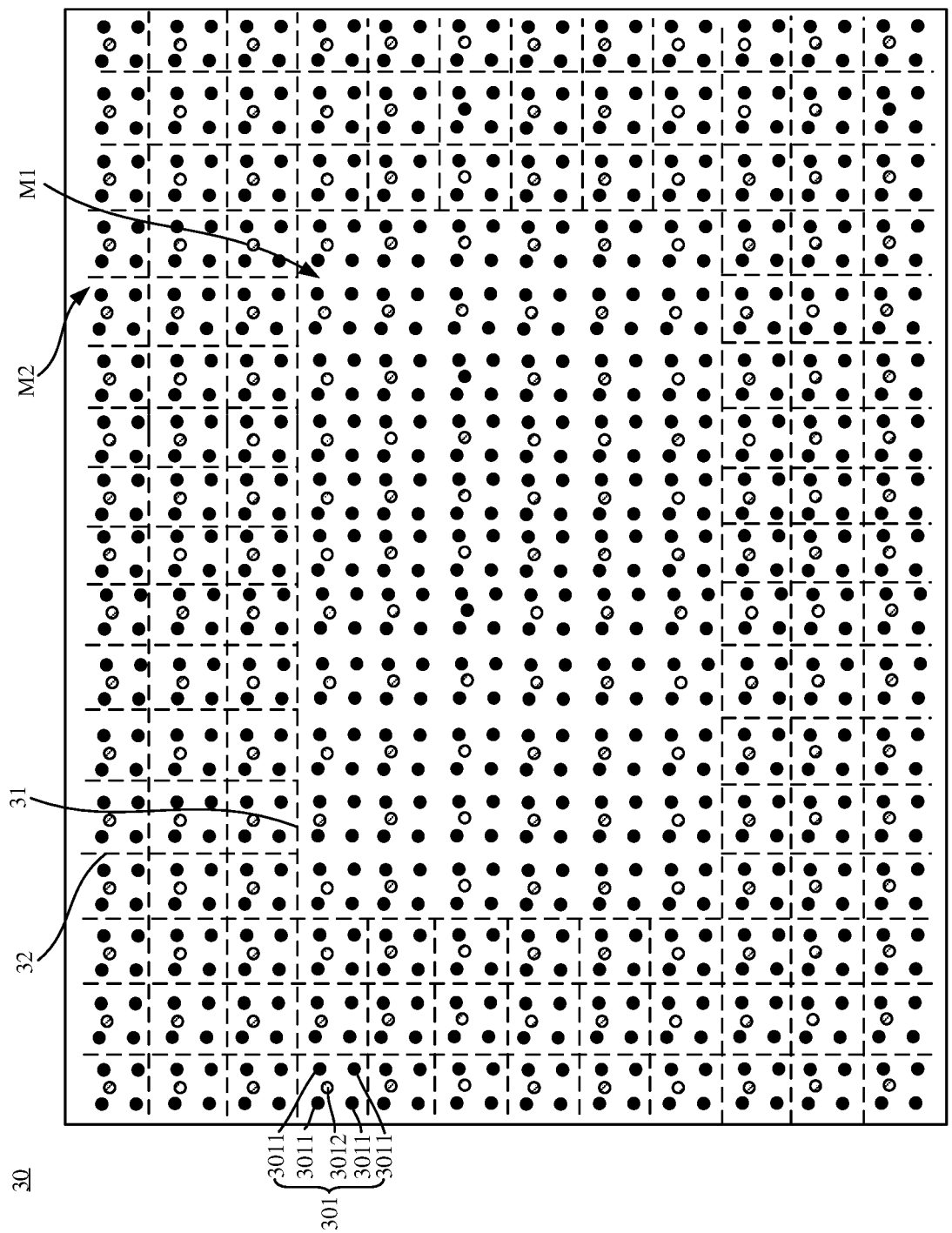
FIG. 6 is a top view of yet another first reflective layer, in accordance with some embodiments.

In some embodiments, as shown in FIGS. 5 and 11, the first reflective layer 30 includes a plurality of second buffer structure groups 32. The plurality of second buffer structure groups 32 are arranged at intervals on the periphery of the central region M1 of the first reflective layer 30, and second slits 320 in two adjacent second buffer structure groups 32 are arranged in a staggered manner. As shown in FIG. 6, the first reflective layer 30 includes a plurality of second buffer structure groups 32, and any two adjacent second buffer structure groups 32 have an interval therebetween. It can be understood that in some embodiments, an interval between two adjacent second buffer structure groups 32 may be a positive integer multiple of a size of a functional region. For example, the two adjacent second buffer structure groups 32 are arranged at an interval with a width of a functional region therebetween. In some embodiments, the interval between two adjacent second buffer structure groups 32 may have a value ranging from 0.8 mm to 2.5 mm, such as 1 mm. In some embodiments, the two adjacent second buffer structure groups 32 may be arranged at interval with another regular. It can be understood that the two adjacent second buffer structure groups 32 refer to that second slits 320 in the two second buffer structure groups 32 are spaced apart in the same direction (e.g., a first direction), and the two second buffer structure groups 32 are adjacently arranged in a non-first direction (e.g., a second direction perpendicular to the first direction).

In this way, buffer regions formed by a plurality of second buffer structure groups 32 are interlaced with each other, and the buffering effect is good. In some embodiments, as shown in FIGS. 6 and 11, any second buffer structure group 32 intersects with at least one first buffer structure group 31. In this way, a plurality of second slits 320 of the second buffer structure groups 32 and a plurality of first slits 310 of the first buffer structure groups 31 form a grid structure, so that the pull force applied to the peripheral region M2 of the first reflective layer 30 is dispersed rather uniformly.

In some embodiments, as shown in FIGS. 3 and 8, the substrate 210 includes a plurality of functional regions 50, and each functional region 50 includes a plurality of electronic components 20 connected in series and/or in parallel.

For example, each functional region 50 includes a plurality of light-emitting devices 21 connected in series and/or in parallel and at least one microchip 22.

For example, as shown in FIGS. 3, 7 and 8, each functional region 50 includes four light-emitting devices 21 sequentially connected in series and one microchip 22. Of course, each functional region 50 may also include five, six, seven or eight light-emitting devices 21, and the connection manner of the plurality of light-emitting devices 21 in the functional region 50 is not limited to a series connection, and may also be a parallel connection. The embodiments of the present disclosure are not limited thereto.

On this basis, as shown in FIGS. 3, 7 and 8, the first slit 310 and/or the second slit 320 may be located between two adjacent functional regions 50. With such provision, each functional region 50 of the first reflective layer 30 has approximately the same deformation and contraction, so that each functional region 50 has approximately the same distribution of luminous centers, thereby improving the uniformity of the brightness distribution of the display device 1000 (referring to FIG. 1) and improving the display effect. It can be understood that some of the first slits 310 and/or the second slits 320 may also be located in a region where a certain functional region 50 is located.

In a case where the second buffer structure groups 32 intersect with at least one first buffer structure group 31 to form a grid structure, at least part of the grid structure may correspond to a functional region 50, that is, the grid structure is provided between adjacent functional regions 50. In some embodiments, the grid structure does not correspond to the functional region 50, that is, the grid structure may pass through a region where the functional region 50 is located. It can be understood that the grid structure and the electronic components 20 provided in the functional region 50 do not interfere with each other.

Figure 10A:
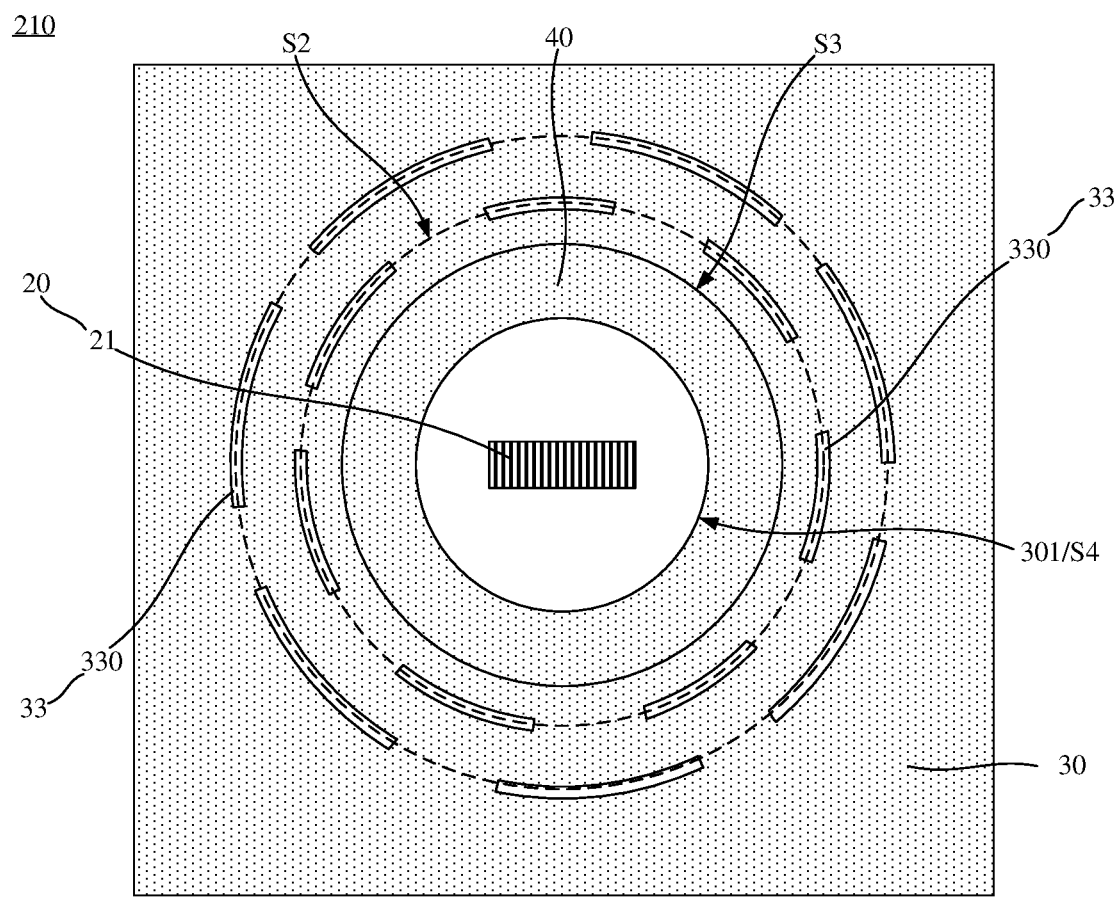
FIG. 10A is a partial enlarged view of an encapsulation portion of a substrate, in accordance with some embodiments.

In some embodiments, referring to FIGS. 7, 8 and 10A, the first reflective layer 30 is further provided with at least one third buffer structure group 33 therein.

Each third buffer structure group 33 includes a plurality of third slits 330 spaced apart from each other, and the plurality of third slits 330 in the third buffer structure group 33 are arranged around an encapsulation portion 40.

In this case, the first reflective layer 30 may contract and deform at the plurality of third slits 330 of the third buffer structure group 33. That is, under the buffering effect of the buffer zone formed by the plurality of third slits 330 of the third buffer structure group 33, the tendency of relative movement between a portion of the first reflective layer 30 in contact with the encapsulation portion 40 and the circuit board 10 is weakened. That is, the pull force of the first reflective layer 30 applied to the encapsulation portion 40 is reduced, so that the risk of cracking of the encapsulation portion 40 may be reduced, and thus the risk of the encapsulation portion 40 peeling off from the circuit board 10 may further be reduced. Moreover, the reduction of the pull force of the first reflective layer 30 applied to the encapsulation portion 40 may also reduce the thrust force generated by the encapsulation portion 40 on the electronic component 20 wrapped by the encapsulation portion 40, thereby reducing the adverse risk of not lighting of the light-emitting device 21 on the substrate 210.

In addition, under the buffering effect of the buffer zone formed by the plurality of third slits 330 of the third buffer structure group 33, the tendency of relative movement between the first reflective layer 30 and the circuit board 10 is weakened, thereby reducing the stretching of the first reflective layer 30 to the circuit board 10 and reducing the warping degree of the circuit board 10 (the substrate 210).

The shape of the third slit 330 may be a regular shape such as a circle, a sector ring or a rectangle, or may be an irregular shape.

For example, the shape of the third slit 330 is substantially a rectangle or a sector ring.

It will be noted that the term "substantially a rectangle or a sector ring" means that the overall shape is a rectangle or sector ring, but not limited to a standard rectangle or sector ring. That is, the "rectangle or sector ring" herein includes not only a standard rectangle or sector ring, but also a shape similar to a rectangle or sector ring in consideration of process conditions. For example, corners or short sides of a rectangle are curved. As another example, corners or short sides of a sector ring are curved.

Figure 10B:
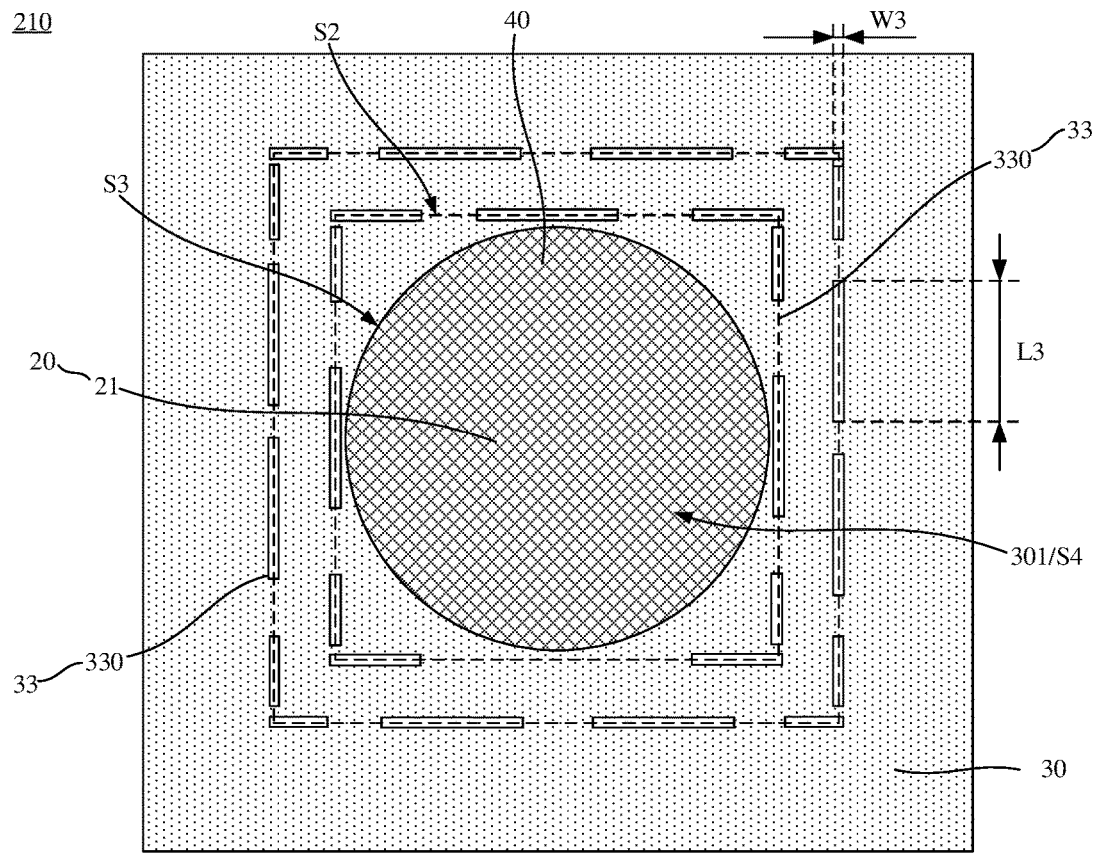
FIG. 10B is a partial enlarged view of an encapsulation portion of another substrate, in accordance with some embodiments.

For example, as shown in FIG. 10B, the shape of the third slit 330 is substantially a rectangle, and long sides of the rectangle extend along the circumferential direction of the encapsulation portion 40.

As another example, as shown in FIG. 10A, the shape of the third slit 330 is substantially a sector ring, and arc edges of the sector ring extend along the circumferential direction of the encapsulation portion 40.

Referring to FIG. 10B, a length L3 of the third slit 330 is approximately in a range of 1.9 mm to 2.1 mm, and a width W3 of the third slit 330 is approximately in a range of 0.02 mm to 0.08 mm. For example, the length L3 of the third slit 330 is approximately any one of 1.9 mm, 2.0 mm or 2.1 mm, and the width W3 of the third slit 330 is approximately any one of 0.02 mm, 0.03 mm, 0.04 mm, 0.05 mm, 0.06 mm, 0.07 mm or 0.08 mm.

It will be noted that in the text, in a case where the shape of the third slit 330 is substantially a sector ring, the length of the third slit 330 refers to a length of the arc edge of the sector ring.

In the above third buffer structure group 33, a ratio of an extension length of each third slit 330 to a distance between two adjacent third slits 330 is not unique.

For example, referring to FIGS. 10A and 10B, all third slits 330 in the third buffer structure group 33 are connected end to end in a clockwise or counterclockwise direction to form a second enclosed pattern S2. The second enclosed pattern S2 has a second circumference, and the second length accounts for at least ¼ of the second circumference, and the second length is a sum of the lengths of the plurality of third slits 330 in the third buffer structure group 33.

In this way, a buffer zone formed by the plurality of third slits 330 in the third buffer structure group 33 has an obvious buffering effect, and the plurality of third slits 330 have a great structural strength and a small risk of breakage.

In some embodiments, as shown in FIGS. 7, 10A and 10B, the first reflective layer 30 is provided with a plurality of third buffer structure groups 33, and at least two third buffer structure groups 33 surround the same encapsulation portion 40. In the at least two third buffer structure groups 33, any two adjacent third buffer structure groups 33 have an interval therebetween. With such provision, a plurality of buffer zones may be formed on the periphery of each encapsulation portion 40. It can be understood that the interval between the two adjacent third buffer structure groups 33 surrounding the same encapsulation portion 40 has a value ranging from 0.5 mm to 1.5 mm, such as 1 mm.

That is, a portion of the first reflective layer 30 in contact with the encapsulation portion 40 may further weaken the tendency of relative movement between the first reflective layer 30 and the circuit board 10 under a buffering effect of a plurality of buffer zones, so that the pull force of the first reflective layer 30 applied to the encapsulation portion 40 may be reduced, thereby further reducing the risk of cracking of the encapsulation portion 40 and the risk of the encapsulation portion 40 peeling off from the circuit board 10, and further reducing the adverse risk of not lighting of the light-emitting device 21 on the substrate 210.

In addition, centers of at least two third buffer structure groups 33 arranged around the same encapsulation portion 40 coincide with the geometric center of the encapsulation portion 40, so that the plurality of buffer zones have approximately equal distance therebetween. As a result, the pull force applied to portions of the first reflective layer 30 located between the buffer zones is dispersed uniformly, thereby avoiding the risk of cracking caused by excessively large pull force applied to a part of portions of the first reflective layer 30 located between the buffer zones.

On this basis, as shown in FIGS. 10A and 10B, in the two adjacent third buffer structure groups 33, in a direction perpendicular to a boundary of the hollow region 301 and parallel to the plane where the circuit board 10 is located, third slits 330 in the two adjacent third buffer structure groups 33 are arranged in a staggered manner.

It will be noted that "the plane where the circuit board 10 is located" refers to the surface of the circuit board 10 with the largest plane area.

In this way, a plurality of buffer zones are formed on the periphery of each encapsulation portion 40, and the buffer region thereof may form a complete enclosed pattern, so that a portion of the first reflective layer 30 in contact with the encapsulation portion 40 may be buffered by the buffer zones in any direction parallel to the plane where the circuit board 10 is located, thereby avoiding the risk of cracking of the encapsulation portion 40 caused by excessively large pull force applied to a part of the encapsulation portion 40 caused by a lack of buffering effect of the buffer zones in the local region of the portion of the first reflective layer 30 in contact with the encapsulation portion 40, which is beneficial to improving the waterproofness and corrosion resistance of the substrate 210.

In some embodiments, referring to FIGS. 10A and 10B, all third slit 330 in the third buffer structure group 33 are connected end to end in a clockwise or counterclockwise direction to form a second enclosed pattern S2. An outer boundary of an orthogonal projection of the encapsulation portion 40 on the circuit board 10 forms a third enclosed pattern S3. An outer boundary of an orthogonal projection of the hollow region 301 on the circuit board 10 forms a fourth enclosed pattern S4.

At least two of the second enclosed pattern S2, the third enclosed pattern S3 and the fourth enclosed pattern S4 are similar figures to each other.

For example, as shown in FIG. 10A, the second enclosed pattern S2, the third enclosed pattern S3 and the fourth enclosed pattern S4 are similar figures one other. For example, the second enclosed pattern S2, the third enclosed pattern S3 and the fourth enclosed pattern S4 are all circular.

In this case, the second enclosed pattern S2 and the third enclosed pattern S3 are similar figures to each other, and a portion of the first reflective layer 30 in contact with the encapsulation portion 40 is subject to substantial the same buffering effect by the buffer zones in any direction parallel to the plane where the circuit board 10 is located, so that the pull force applied to the encapsulation portion 40 is dispersed uniformly, thereby avoiding the risk of cracking caused by excessively large pull force applied to a part of the encapsulation portion 40. In addition, the third enclosed pattern S3 and the fourth enclosed pattern S4 are similar figures to each other, and thus the sealing and reliability of the encapsulation portion 40 covering the hollow region 301 are relatively high, thereby improving the waterproofness and corrosion resistance of the substrate 210.

It will be understood that a ratio of a size of the second enclosed pattern S2 to a size of the third enclosed pattern S3 is not unique.

In some examples, as shown in FIG. 10A, both the second enclosed pattern S2 and the third enclosed pattern S3 are circular. A ratio of a diameter of a second enclosed pattern S2 corresponding to a third buffer structure group 33 closest to the encapsulation portion 40 to a diameter of the encapsulation portion 40 is greater than 1 and less than or equal to 1.2.

In this way, an area of the part of the first reflective layer 30 located within the innermost buffer zone will not be too large, the amount of expansion and contraction is relatively small, and the displacement accumulation at the portion of the first reflective layer 30 in contact with the encapsulation portion 40 is reduced, thereby reducing the risk of cracking of the encapsulation portion 40.

In some other examples, as shown in FIG. 10B, the second enclosed pattern S2 is in a shape of a polygon (e.g., a rectangle), and the third enclosed pattern S3 is in a shape of a circle. A ratio of a length of a diagonal of a second enclosed pattern S2 corresponding to a third buffer structure group 33 closest to the encapsulation portion 40 to a diameter of the encapsulation portion 40 is greater than 1 and less than or equal to 1.2.

In this way, an area of the part of the first reflective layer 30 located within the innermost buffer zone will not be too large, the amount of expansion and contraction is relatively small, and the displacement accumulation at the portion of the first reflective layer 30 in contact with the encapsulation portion 40 is reduced, thereby reducing the risk of cracking of the encapsulation portion 40.

In addition, a distance between the plurality of second enclosed patterns S2 formed by the plurality of third buffer structure groups 33 is not unique.

In some examples, as shown in FIG. 10A, both the second enclosed pattern S2 and the third enclosed pattern S3 are circular. At least two third buffer structure groups 33 are arranged around the same encapsulation portion 40. In the at least two third buffer structure groups 33, a ratio of a difference between diameters of two second enclosed patterns S2 corresponding to any two adjacent third slits 330 to the diameter of the encapsulation portion 40 is greater than 0 and less than or equal to 0.2.

In this way, any two adjacent third slits 330 have a relatively close distance therebetween, and the buffering effect is good.

In some other examples, as shown in FIG. 10B, the second enclosed pattern S2 is in a shape of a polygon (e.g., a rectangle), and the third enclosed pattern S3 is in a shape of a circle. At least two third buffer structure groups 33 are arranged around the same encapsulation portion 40. In the at least two third buffer structure groups 33, a ratio of a difference between lengths of diagonals of two second enclosed patterns S2 corresponding to any two adjacent third buffer structure groups 33 to the diameter of the encapsulation portion 40 is greater than 0 and less than or equal to 0.2.

In this way, any two adjacent third slits 330 have a relatively close distance therebetween, and the buffering effect is good.

It can be understood that the first reflective layer 30 may further be provided with a plurality of through holes (not shown in the figures) therein, and the through holes are used to correspond to regions of the substrate 210 on which support structures are provided. The support structure is used to provide an optical distance (OD) required by the backlight module. That is, an end of the support structure abuts against the substrate 210, and the other end of the support structure abuts against a surface of an optical film of the plurality of optical film 220 closest to the substrate 210. A size of the through hole is consistent with a size of a portion of the surface where the support structure abuts against the substrate 210. The arrangement regularity of the through holes is at least the same as the arrangement regularity of the support structures on the substrate 210. The through hole does not interfere with any one of a first buffer structure group 31, a second buffer structure group 32, a third buffer structure group 33, and a hollow region 301.

In some embodiments, referring to FIGS. 7 and 8, the above substrate 210 further includes a second reflective layer 60, and the second reflective layer 60 is disposed between the first reflective layer 30 and the circuit board 10.

It will be noted that the material of the second reflective layer 60 may include white ink and/or silicone white adhesive. For example, the material of the second reflective layer 60 may include resin (e.g., epoxy resin or polytetrafluoroethylene resin), titanium dioxide ($TiO_2$) and an organic solvent (e.g., dipropylene glycol methyl ether).

It will be understood that the second reflective layer 60 may be directly disposed on the circuit board by a coating process, and the first reflective layer may be adhered to a surface of the second reflective layer away from the circuit board.

Based on this, referring to FIGS. 9A and 9B, the second reflective layer 60 is provided with a plurality of openings 601 therein. In a direction perpendicular to the boundary of the electronic component 20 and parallel to the plane where the circuit board 10 is located, a ratio of a length of the electronic component 20 to a length of the opening 601 is in a range of 0.5 to 0.7.

An electronic component 20 is located in an opening 601, and an opening 601 is located in a hollow region 301. For example, in a direction perpendicular to a boundary of the opening 601 and parallel to the plane where the circuit board 10 is located, a ratio of the length of the opening 601 to a length of the hollow region 301 is in a range of 0.15 to 0.30.

In this case, the light emitted by the light-emitting device 21 towards a region between the hollow region 301 and the opening 601 may be reflected by the second reflective layer 60 to the display panel 100, thereby further improving the light extraction efficiency of the substrate 210 and improving the display effect.

Figure 13:
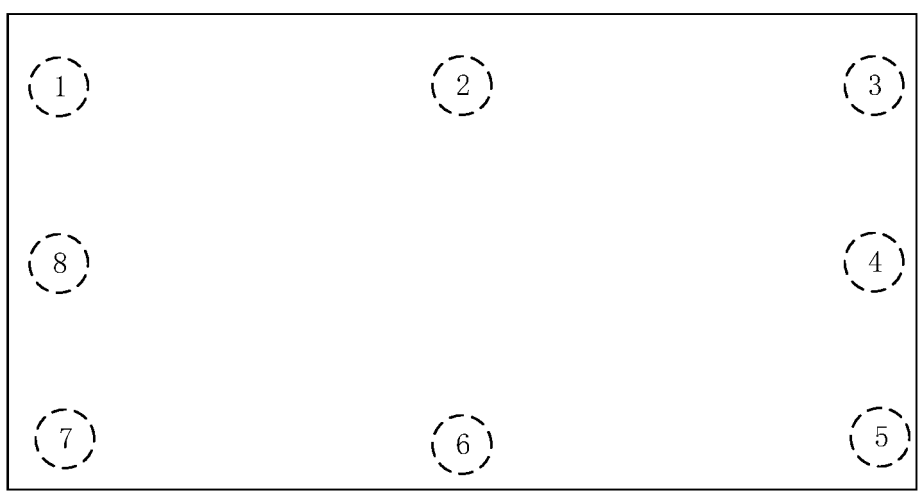
FIG. 13 is a schematic diagram of location of each test point.

In order to objectively evaluate the technical effects of the embodiments of the present disclosure, the substrate provided in the above embodiments is subjected to a warpage test. FIG. 13 is a schematic diagram of location of each test point. The test results are shown in Table 1.

TABLE 1

| warpage test table of substrate | | | | |
| --- | --- | --- | --- | --- |
| Test point | Related art 1 (mm) | Related art 2 (mm) | Embodiment 1 (mm) | Embodiment 2 (mm) |
| 1 | 3.55 | 3.8 | 2.55 | 2.85 |
| 2 | 2.35 | 2.05 | 2.0 | 1.95 |
| 3 | 2.1 | 2.1 | 2.1 | 2.05 |
| 4 | 1.4 | 1.6 | 1.4 | 1.1 |
| 5 | 3.55 | 3.4 | 2.9 | 2.8 |
| 6 | 2.25 | 2.05 | 2.1 | 1.75 |
| 7 | 2.15 | 2.3 | 2.15 | 1.3 |
| 8 | 1.3 | 1.75 | 1.15 | 1.05 |
| MAX | 3.55 | 3.8 | 2.9 | 2.85 |

Related art 1 and Related art 2 both represent embodiments in which the first reflective layer is a continuous whole layer, Embodiment 1 represents an embodiment in which the first reflective layer in the embodiment of the present disclosure includes first buffer structure group(s), and Embodiment 2 represents an embodiment in which the first reflective layer in the embodiment of the present disclosure includes first buffer structure group(s), second buffer structure group(s) and third buffer structure group(s). MAX represents the maximum value of warpage among the 8 test points.

It can be seen from Table 1 that the maximum value of the warpage of the substrate in the embodiments of the present disclosure is much smaller than the maximum value of the warpage of the substrate in the related arts, and the warpage of the substrate is reduced.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A substrate, comprising:
   a circuit board; and
   a first reflective layer disposed on the circuit board; the first reflective layer having a central region and a peripheral region surrounding the central region; the first reflective layer including at least one first buffer structure group and at least one second buffer structure group, an orthogonal projection of the at least one first buffer structure group on the circuit board falling into the peripheral region, and an orthogonal projection of the at least one second buffer structure group on the circuit board falling into the peripheral region; wherein
   each first buffer structure group includes a plurality of first slits spaced apart from each other, and a plurality of first slits in any first buffer structure group are disposed around the central region; and each second buffer structure group includes at least one second slit extending in a direction perpendicular to a boundary of the central region.

2. The substrate according to claim 1, wherein the at least one first buffer structure group includes a plurality of first buffer structure groups, any two adjacent first buffer structure groups have an interval therebetween, and centers of the plurality of first buffer structure groups coincide with a geometric center of the central region.

3. The substrate according to claim 2, wherein in two adjacent first buffer structure groups, first slits in the two adjacent first buffer structure groups are disposed in a staggered manner in a direction perpendicular to a boundary of the central region and parallel to a plane where the circuit board is located.

4. The substrate according to claim 3, wherein all first slits in the first buffer structure group are connected end to end in a clockwise or counterclockwise direction to be a first enclosed pattern; and
the first enclosed pattern has a first circumference, a first length accounts for at least ¼ of the first circumference, and the first length is a sum of lengths of the plurality of first slits in the first buffer structure group.

5. The substrate according to claim 1, wherein
the at least one slit includes a plurality of second slits, and the plurality of second slits extend in a same direction and are spaced apart from each other.

6. The substrate according to claim 5, wherein the at least one second buffer structure group includes a plurality of second buffer structure groups, the plurality of second buffer structure groups are disposed at intervals on a periphery of the central region of the first reflective layer, and second slits in two adjacent second buffer structure groups are disposed in a staggered manner; and/or
any second buffer structure group intersects with at least one first buffer structure group.

7. The substrate according to claim 1, further comprising a plurality of electronic components, wherein the substrate has a plurality of functional regions, and each functional region is provided thereon with multiple electronic components connected in series and/or in parallel;
a first slit is located between two adjacent functional regions; and
a second slit is located between the two adjacent functional regions.

8. The substrate according to claim 1, wherein an area of the peripheral region accounts for 15% to 25% of an area of a surface of the first reflective layer parallel to the circuit board.

9. The substrate according to claim 1, further comprising:
a plurality of electronic components disposed on the circuit board; and
a plurality of encapsulation portions, an encapsulation portion wrapping at least one electronic component; wherein the first reflective layer further includes a plurality of hollow regions and at least one third buffer structure group; an electronic component is located in a hollow region, and the encapsulation portion covers at least one hollow region; each third buffer structure group includes a plurality of third slits spaced apart from each other, and multiple third slits in a third buffer structure group are disposed around the encapsulation portion.

10. The substrate according to claim 9, wherein the at least one third buffer structure group includes a plurality of third buffer structure groups, at least two third buffer structure groups are disposed around the same encapsulation portion, and in the at least two third buffer structure groups, any two adjacent third buffer structure groups have an interval therebetween.

11. The substrate according to claim 10, wherein centers of the at least two third buffer structure groups disposed around the same encapsulation portion coincide with a geometric center of the encapsulation portion; and/or
in two adjacent third buffer structure groups, third slits in the two adjacent third buffer structure groups are disposed in a staggered manner in a direction perpendicular to a boundary of the hollow region and parallel to a plane where the circuit board is located.

12. The substrate according to claim 9, wherein all third slits in each third buffer structure group are connected end to end in a clockwise or counterclockwise direction to be a second enclosed pattern; an outer boundary of an orthogonal projection of the encapsulation portion on the circuit board constitutes a third enclosed pattern; and an outer boundary of an orthogonal projection of the hollow region on the circuit board constitutes a fourth enclosed pattern; wherein
at least two of the second enclosed pattern, the third enclosed pattern and the fourth enclosed pattern are similar figures to each other.

13. The substrate according to claim 12, wherein the second enclosed pattern and the third enclosed pattern are each in a shape of a circle; and
a ratio of a diameter of a second enclosed pattern corresponding to a third buffer structure group closest to the encapsulation portion to a diameter of the encapsulation portion is greater than 1 and less than or equal to 1.2; and/or
at least two third buffer structure groups are disposed around the same encapsulation portion, and in the at least two third buffer structure groups, a ratio of a difference between diameters of two second enclosed patterns corresponding to any two adjacent third buffer structure groups to the diameter of the encapsulation portion is greater than 0 and less than or equal to 0.2.

14. The substrate according to claim 12, wherein the second enclosed pattern is in a shape of a polygon, and the third enclosed pattern is in a shape of a circle;
a ratio of a length of a diagonal of a second enclosed pattern corresponding to a third buffer structure group closest to the encapsulation portion to a diameter of the encapsulation portion is greater than 1 and less than or equal to 1.2; and/or
at least two third buffer structure groups are disposed around the same encapsulation portion, and in the at least two third buffer structure groups, a ratio of a difference between lengths of diagonals of two second enclosed patterns corresponding to any two adjacent third buffer structure groups to the diameter of the encapsulation portion is greater than 0 and less than or equal to 0.2.

15. The substrate according to claim 9, wherein all third slits in each third buffer structure group are connected end to end in a clockwise or counterclockwise direction to be a second enclosed pattern; and
the second enclosed pattern has a second circumference, a second length accounts for at least ¼ of the second circumference, and the second length is a sum of lengths of the multiple third slits in the third buffer structure group.

16. The substrate according to claim 1, wherein a length of a first slit is approximately in a range of 1.9 mm to 2.1 mm, and a width of the first slit is approximately in a range of 0.02 mm to 0.08 mm;

a length of a second slit is approximately in a range of 1.9 mm to 2.1 mm, and a width of the second slit is approximately in a range of 0.02 mm to 0.08 mm; and the first reflective layer further includes at least one third buffer structure group, each third buffer structure group includes a plurality of third slits, a length of a third slit is approximately in a range of 1.9 mm to 2.1 mm, and a width of the third slit is approximately in a range of 0.02 mm to 0.08 mm.

17. The substrate according to claim 1, wherein the first reflective layer further includes a plurality of hollow regions; and the substrate further comprises:

a plurality of electronic components disposed on the circuit board, an electronic component being located in a hollow region; and a second reflective layer disposed between the first reflective layer and the circuit board; the second reflective layer being provided with a plurality of openings therein, the electronic component being located in an opening, and the opening being located in the hollow region.

18. The substrate according to claim 17, wherein in a direction perpendicular to a boundary of the electronic component and parallel to a plane where the circuit board is located, a ratio of a length of the electronic component to a length of the opening is in a range of 0.5 to 0.7; and/or in a direction perpendicular to a boundary of the opening and parallel to the plane where the circuit board is located, a ratio of the length of the opening to a length of the hollow region is in a range of 0.15 to 0.3.

19. A backlight module, comprising:

the substrate according to claim 1, the substrate has a light-emitting surface and a non-light-emitting surface that are opposite; and a plurality of optical films disposed on the light-emitting surface of the substrate.

20. A display device, comprising:

the backlight module according to claim 19; and a display panel disposed on a side of the plurality of optical films in the backlight module away from the substrate.

* * * * *

UNITED STATES PATENT AND TRADEMARK OFFICE
CERTIFICATE OF CORRECTION

PATENT NO. : 12,306,495 B2
APPLICATION NO. : 18/692405
DATED : May 20, 2025
INVENTOR(S) : Chenyang Wang et al.

Page 1 of 1

It is certified that error appears in the above-identified patent and that said Letters Patent is hereby corrected as shown below:

On the Title Page

Column 2, item (57), Abstract, Line 8, delete "barrier" and insert -- buffer --

Signed and Sealed this
Eighth Day of July, 2025

Coke Morgan Stewart
*Acting Director of the United States Patent and Trademark Office*